Figure 1:
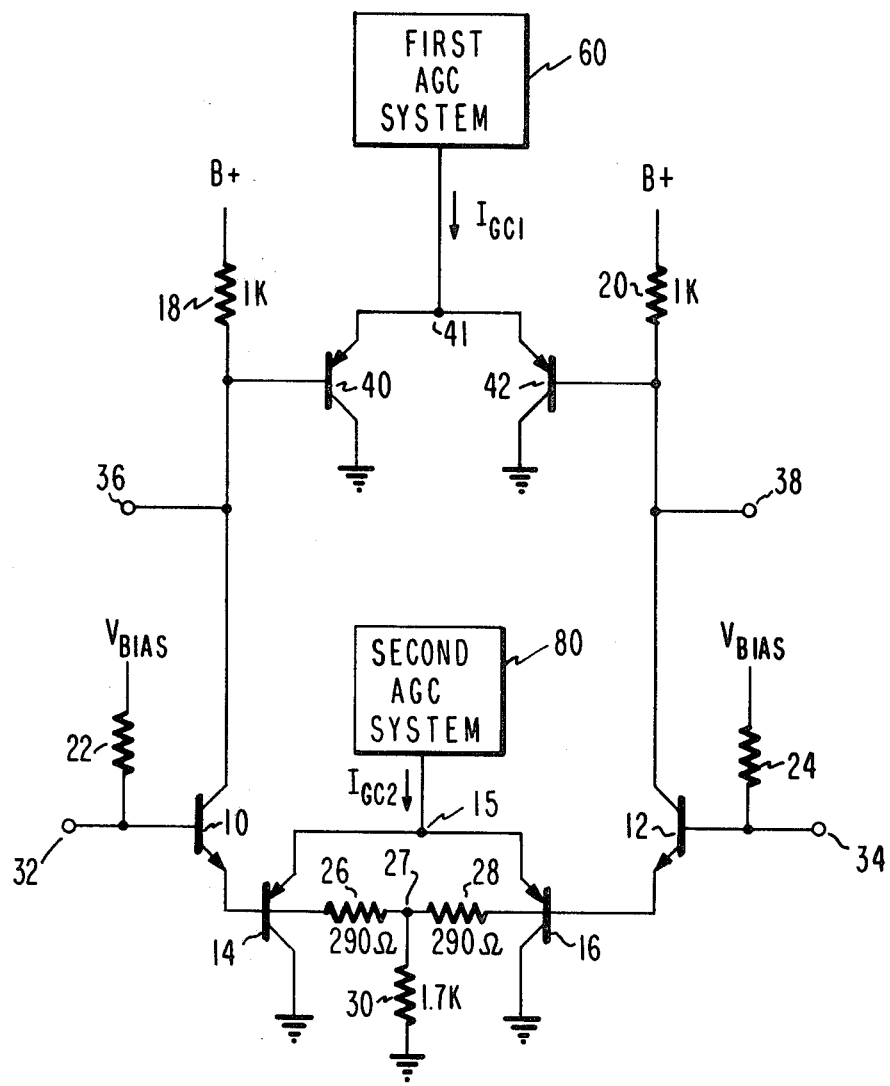

United States Patent [19]

Harford

[11] 4,344,044
[45] Aug. 10, 1982

[54] GAIN-CONTROLLED AMPLIFIER UTILIZING VARIABLE EMITTER DEGENERATION AND COLLECTOR LOAD IMPEDANCE

[75] Inventor: Jack R. Harford, Flemington, N.J.
[73] Assignee: RCA Corporation, New York, N.Y.
[21] Appl. No.: 143,034
[22] Filed: Apr. 23, 1980
[51] Int. Cl.$^3$ ............................................. H03F 3/45
[52] U.S. Cl. ..................................... 330/254; 330/283
[58] Field of Search ............... 330/254, 284, 283, 304, 330/143, 144, 145; 332/31 T

[56] References Cited

U.S. PATENT DOCUMENTS

| | | | |
|---|---|---|---|
| 3,444,474 | 5/1969 | Borenstein et al. | 330/304 |
| 3,641,450 | 2/1972 | Lunn | 330/254 |
| 3,706,937 | 12/1972 | Hanna | 330/254 |
| 3,838,210 | 9/1974 | Peil . | |
| 3,942,181 | 3/1976 | Berrod et al. | 330/254 |
| 3,976,951 | 8/1976 | Ishigaki et al. . | |
| 4,065,725 | 12/1977 | Lillis et al. | 330/254 |
| 4,131,809 | 12/1978 | Baars | 307/303 |
| 4,134,078 | 1/1979 | Arai et al. | 330/254 |
| 4,255,716 | 3/1981 | Takada | 330/284 |
| 4,267,518 | 5/1981 | Davis | 330/254 |

OTHER PUBLICATIONS

Schatter, E., "Monolithic TV IF System TBA 440", IEEE Trans. on BTR, vol. BTR-18, No. 3, Aug. 1972, p. 158.

Primary Examiner—James B. Mullins
Assistant Examiner—Gene Wan
Attorney, Agent, or Firm—Paul J. Rasmussen; William H. Meagher; W. Brinton Yorks, Jr.

[57] ABSTRACT

A gain-controlled amplifier is provided which utilizes both controlled load impedance variation and controlled emitter degeneration variation to vary the gain of the amplifier. The amplifier includes an amplifying transistor which is direct-current coupled in a common emitter configuration. The collector load impedance of the amplifying transistor includes a first controlled resistance device having a base electrode coupled to the collector electrode of the amplifying transistor, an emitter electrode coupled to receive a first gain controlling current, and a collector electrode coupled to a point of reference potential. The emitter impedance of the amplifying transistor includes a second controlled resistance device having a base electrode coupled to the emitter electrode of the amplifying transistor, an emitter electrode coupled to receive a second gain controlling current and a collector electrode coupled to a point of reference potential. At signal frequencies, the base-to-emitter junctions of the controlled resistance devices act as resistances which can be varied inversely with the flow of gain controlling current through the emitter-to-collector paths of the devices. The total gain reduction range of the amplifier is the product of the ranges due to both the collector load impedance and the emitter degeneration controlled gain reduction. The gain controlling currents which are applied to the two devices may be independently controlled, serially controlled, or may be varied simultaneously.

14 Claims, 2 Drawing Figures

GAIN-CONTROLLED AMPLIFIER UTILIZING VARIABLE EMITTER DEGENERATION AND COLLECTOR LOAD IMPEDANCE

This invention relates to transistor amplifier circuits and, in particular, to a gain-controlled transistor amplifier circuit in which both emitter degeneration and collector load impedance are variably controlled to vary the gain of the amplifier without disturbing the D.C. biasing of the amplifier.

A novel gain-controlled amplifier is described in my U.S. patent application No. 143,032, entitled "VARIABLE LOAD IMPEDANCE GAIN-CONTROLLED AMPLIFIER," concurrently filed herewith. The amplifier described in that patent application utilized a controlled resistance device to vary the collector load impedance and hence the load line of the amplifier in response to a gain control signal. This amplifier is particularly advantageous in that the resistance of the collector load device is varied by the gain control signal without upsetting the D.C. biasing of the amplifying transistor.

A second gain-controlled amplifier is described in my U.S. patent application No. 143,035, entitled "VARIABLE EMITTER DEGENERATION GAIN-CONTROLLED AMPLIFIER," also concurrently filed herewith. The amplifier described in this second patent application utilizes a controlled resistance device to vary the emitter resistance, and hence the amount of degeneration, of the amplifier in response to variation in the gain control signal applied to the device. As in the case of the amplifier described in the first patent application, the resistance of the device can be varied without affecting the D.C. biasing of the amplifying transistor.

In the first patent application No. 143,032, the collector impedance modulated amplifier shown in FIG. 1 of that application was seen to have a 20 db range of gain control. The emitter degeneration controlled amplifier shown in FIG. 2 of the second patent application No. 143,032 was seen to have a 10 db range of gain control. It may be desirable, in a particular circuit configuration, to have an amplifier with a range of gain control equal to the product of both of the above-described arrangements. By using an amplifier with such an extended range of gain control, the need for additional gain-controlled amplifiers may be eliminated.

It may further be desirable to utilize an amplifier which is responsive to two different gain control signals for gain reduction. For instance, in a television receiver, three modes of gain reduction are often required. In the first mode, the gain of the intermediate frequency (I.F.) amplifier is reduced. During the second mode, the gain of the I.F. amplifier remains constant as the gain of the radio frequency (R.F.) amplifier is reduced. Finally, a third mode is reached during which the gain of the R.F. amplifier remains constant as the I.F. gain is reduced still further.

Additionally, it is desirable to provide an amplifier which is responsive to two independently varying gain control signals. The gain control signals may be varied serially, or may be simultaneously varied to change the gain of the amplifier.

In accordance with the principles of the present invention, a gain-controlled amplifier is provided which utilized both controlled load impedance variation and controlled emitter degeneration variation to vary the gain of the amplifier. The amplifier includes an amplifying transistor which is resistively coupled in a common emitter configuration. The collector load impedance of the amplifying transistor includes a first controlled resistance device having a base electrode coupled to the collector electrode of the amplifying transistor, an emitter electrode coupled to receive a first gain controlling circuit, and a collector electrode coupled to a point of reference potential. The emitter impedance of the amplifying transistor includes a second controlled resistance device having a base electrode coupled to the emitter electrode of the amplifying transistor, an emitter electrode coupled to receive a second gain controlling current and a collector electrode coupled to a point of reference potential. At signal frequencies, the base-to-emitter junctions of the controlled resistance devices act as resistances which can be varied inversely with the flow of gain controlling current through the emitter-to-collector paths of the devices. As the gain controlling current applied to the first device increases, the collector load impedance of the amplifying transistor is reduced, and the gain of the amplifier is reduced. As the gain controlling current applied to the second device decreases, the emitter impedance of the amplifying transistor is increased, thereby increasing the emitter degeneration and hence reducing the gain of the amplifier. The total gain reduction range of the amplifier is the product of the ranges due to both the collector load impedance and the emitter degeneration controlled gain reduction. The gain controlling currents which are applied to the two devices may be independently controlled, serially controlled, or may be varied simultaneously. The gain controlling currents may be derived from a single variable current source, or may be independently derived currents.

Figure 2:
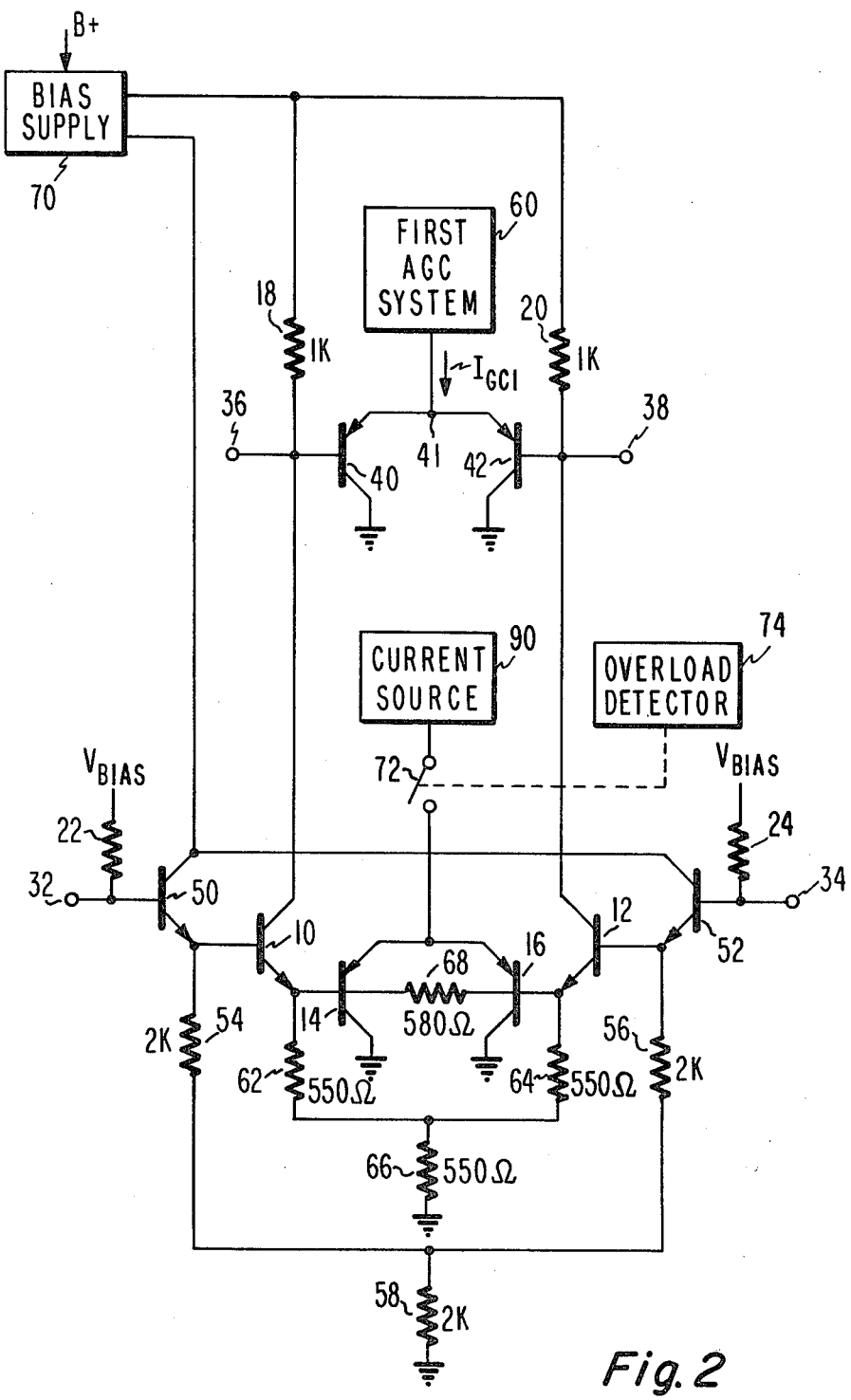

In the drawings,

FIG. 1 illustrates, partially in block diagram form and partially in schematic diagram form, a gain-controlled amplifier utilizing variable collector load impedance and emitter degeneration in accordance with the principles of the present invention; and FIG. 2 illustrates, partially in block diagram form and partially in schematic diagram form, a gain-controlled amplifier including input buffering and means for preventing overload due to the sudden reception of large input signals.

Referring to FIG. 1, a gain-controlled differential amplifier is shown, including amplifying transistors 10 and 12. An input signal is applied between the base electrode of the amplifying transistors at terminals 32 and 34, and the amplified output signal is derived between the collector electrodes of the two transistors at terminals 36 and 38. Load resistors 18 and 20 are coupled between the respective collector electrodes of the amplifying transistors and a source of supply voltage (B+). Base bias for transistors 10 and 12 is supplied by resistors 22 and 24, which are coupled between the respective base electrodes and a bias voltage source ($V_{BIAS}$). The emitters of the two amplifying transistors are coupled together by two resistors 26 and 28. A resistor 30 is coupled between the junction 27 of resistors 26 and 28 and a point of reference potential (ground).

The collector electrodes of transistors 10 and 12 are also coupled to the base electrodes of first and second controlled resistance devices 40 and 42, respectively. The controlled resistance devices have collector electrodes coupled to ground, and joined emitter electrodes. A first AGS system 60 is coupled to the joined emitter electrodes of the controlled resistant devices at a junction point 41, and supplies gain controlling current $I_{GC1}$ to the devices.

The emitter electrodes of transistors 10 and 12 are also coupled to the base electrodes of third and fourth controlled resistance devices 14 and 16, respectively. The controlled resistance devices have collector electrodes coupled to ground, and joined emitter electrodes. A second AGC system 80 is coupled to the joined emitter electrodes of the controlled resistance devices and supplies gain controlling current $I_{GC2}$ to the devices.

The controlled resistance devices 40, 42, 14 and 16 may be ordinary transistors and, in a preferred embodiment of the present invention, may operate in the same manner as the controlled resistance devices described in my U.S. patent application No. 143,033, entitled "GAIN-CONTROLLED AMPLIFIER USING A CONTROLLABLE ALTERNATING-CURRENT RESISTANCE," concurrently filed herewith. Briefly, the devices of the preferred embodiment are constructed in a similar manner as a vertical PNP transistor, with the base regions each comprising a region of substantially intrinsic (high resistivity) semiconductive material. This intrinsic region separates the P+ emitter region and an N+ base contact region by a distance which is greater than the diffusion length of minority carriers injected into the intrinsic region from the emitter region in response to the emitter-to-collector flow of gain controlling current $I_{GC}$. The emitter-base junction of the device thus acts as a nonrectifying PIN diode to high frequency (i.e., greater than one Megahertz) signals. The resistance of the emitter-base junction of the device is modulated by the flow of $I_{GC}$ current from the AGC system, and will decrease as the flow of $I_{GC}$ current increases. Substantially all of the $I_{GC}$ current flows in the emitter-to-collector path of the device, with only a small D.C. current flowing in the base of the device. This base current is insignificant by comparison with the collector and emitter currents of transistors 10 and 12, and hence will not upset the D.C. biasing of the amplifying transistors 10 and 12.

The differential amplifier configuration of FIG. 1 is balanced for complementary input signals about junction point 41 at the joined emitter electrodes of the first and second controlled resistance devices 40 and 42. This junction point 41 will therefore be a virtual signal null point for the amplified input signals. This configuration results in the base-to-emitter resistances of the devices 40 and 42 being in parallel with load resistors 18 and 20, respectively, since each impedance is coupled between the collector of an amplifying transistor and a point of signal reference potential (B+ or junction point 41).

Similarly, the differential amplifier configuration of FIG. 1 is balanced about junction points 15 and 27 at the center of the arrangement. These junction points will therefore be virtual signal null points for complementary input signals applied to terminals 32 and 34. With these points being virtual signal ground points, transistor 10 effectively has an emitter impedance for A.C. signals comprising the base-to-emitter resistance of device 14 in parallel with resistor 26, coupled between the emitter of the transistor and signal reference potential. Likewise, the A.C. emitter impedance of transistor 12 comprises the parallel combination of resistor 28 and the base-to-emitter junction of device 16. Resistor 30 completes the D.C. emitter biasing paths for the two transistors.

The voltage gain of the amplifier is calculated as:

$$V_{GAIN} = Z_L/R_E$$

for each transistor, where $Z_L$ is the parallel impedance of resistor 18 (or 20) and the base-to-emitter resistance of device 40 (or 42), and $R_E$ is the parallel impedance of resistor 26 (or 28) and the base-to-emitter resistance of device 14 (or 16), plus the dynamic emitter resistance $r_e$ of the amplifying transistor. For high signal frequency applications, parasitic capacitances must also be taken into consideration.

In operation, the gain-controlled amplifier will be in a maximum gain condition when $I_{GC1}$ equals zero and $I_{GC2}$ is at a maximum. Under these conditions, zero $I_{GC1}$ causes the resistances of devices 40 and 42 to be at a maximum, which maximizes $Z_L$. Likewise, the large $I_{GC2}$ flow minimizes the resistances of devices 14 and 16, which minimizes $R_E$. The ratio of $Z_L$ to $R_E$ is at a maximum under these conditions.

To traverse the gain control range from maximum gain to minimum gain, $I_{GC1}$ is increased from zero to its maximum value, and $I_{GC2}$ is reduced from its maximum value to zero. This reduces the resistances of the first and second devices 40 and 42 and increases the resistances of the third and fourth devices 14 and 16, thereby minimizing $Z_L$ while maximizing $R_E$.

The currents supplied by the first and second AGC system 60 and 80 will predominantly flow through the emitter-to-collector paths of the controlled resistance devices 40, 42, 14 and 16. Only the very small base currents of these devices will be combined with the collector and emitter currents of transistors 10 and 12. Since the base currents are insignificant as compared with the amplifying transistor collector and emitter currents, modulation of the resistances of the devices will have substantially no effect on the D.C. biasing of the amplifying transistors. Moreover, by varying $I_{GC1}$ and $I_{GC2}$ simultaneously in a complementary manner for gain control, even the very small collector voltage changes due to the device base current components in the D.C. biasing paths at transistors 10 and 12 can be reduced. This is due to the fact that currents $I_{GC1}$ and $I_{GC2}$, and hence the base currents of the devices, vary oppositely in magnitude for the same sense of gain variation. For instance, a constant current I could be split into two components, $I_1$ and $I_2$, which are used to vary the resistance of the collector and emitter-connected controlled resistance devices, respectively. By varying the ratio of $I_1$ to $I_2$, the gain of the amplifier can be controlled from maximum gain when the $I_1/I_2$ ratio is at a maximum, to minimum gain when the ratio is at a minimum. Since the total gain control current I remains substantially constant, and the emitter bias resistor currents remain substantially constant, the current through load resistors 18 and 20 will therefore be held substantially constant throughout the gain control range.

The arrangement of FIG. 1 advantageously lends itself to use as an I.F. amplifier in a television three-stage AGC system as described above. For instance, during the first stage of I.F. gain reduction, $I_{GC1}$ can be increased for gain reduction as $I_{GC2}$ is held constant. During the third stage of gain reduction, $I_{GC2}$ can be decreased to afford additional I.F. gain reduction. This sequence of gain control is seen to result in $I_{GC1}$ and $I_{GC2}$ being at maximum values during the second stage, when the gain of the R.F. amplifier is being controlled. If this is undesirable, gain reduction can be achieved by reducing $I_{GC2}$ during the first stage, and increasing $I_{GC1}$ during the third stage.

The arrangement of FIG. 1 has been examined with the amplifying transistors 10 and 12 biased for approximately one milliampere of D.C. emitter current, which causes $r_e$ to be approximately 30 ohms. $I_{GC1}$ was then varied from zero to two milliamperes, causing $Z_L$ for each transistor to vary from approximately 700 ohms to 73 ohms, a gain reduction range of 20 db. $I_{GC2}$ was then varied from an initial value of 3.5 milliamperes to zero milliamperes, causing $R_E$ (including approximately 30 ohms or $r_3$) to vary from 76 ohms to 242 ohms, a gain reduction range of 10 db. Thus, a total gain reduction range of at least 30 db can be attained.

In the arrangement of FIG. 1, the collector-base capacitance of the amplifying transistors 10 and 12 may degrade the performance of the amplifier when used as an I.F. amplifying stage in a television receiver. Feedback due to this capacitance at the input electrodes can detune the selectivity of preceding circuits which are coupled to terminals 32 and 34. In the arrangement of FIG. 2, these effects of the collector-base capacitance are reduced, and provision is made for causing the amplifier to respond to sudden increases in input signal level. Components of FIG. 2 performing the same function as those in FIG. 1 bear the same reference numerals.

In the arrangement of FIG. 2, amplifying transistors 10 and 12 are buffered at their base inputs by emitter-follower coupled transistors 50 and 52. Terminal 32 and bias resistor 22 are coupled to the base of transistor 50, the emitter of which is coupled to the base of transistor 10 and a resistor 54. Terminal 34 and bias resistor 24 are coupled to the base of transistor 52, the emitter of which is coupled to the base of transistor 12 and to a resistor 56.

The collectors of transistors 50 and 52 are coupled together, and receive supply voltage from a bias supply 70. The bias supply 70 also provides supply voltage for collector load resistors 18 and 20.

Resistors 26 and 28 of FIG. 1 are replaced by a single resistor 68 in FIG. 2, which is coupled between the emitter electrodes of transistors 10 and 12. Resistors 62 and 62 are serially coupled between the emitters of transistor 10 and 12, and a resistor 66 is coupled between the junction of these two resistors and ground to complete the D.C. emitter biasing paths for transistors 10 and 12.

The effects of the collector-base capacitance of transistors 10 and 12 are present at the bases of these transistors. However, these effects are buffered from the input terminals 32 and 34 by the emitter-follower coupled transistors 50 and 52. The input impedance of the bases of transistors 50 and 52 remain substantially constant because the changing effect of the collector-base capacitance of transistors 10 and 12 during gain variation is effectively divided by the betas of the buffer transistors. The respective junctions of the emitters of transistors 50 and 52 and the bases of transistors 10 and 12 remain at a substantially fixed D.C. bias level by virtue of the connection of bias resistors 54, 56 and 58.

The gain of the gain-controlled amplifier of FIG. 2 is controlled by varying the current supplied by the first AGC system 60 to the collector controlled resistance devices 40 and 42. The second AGC system 80 of FIG. 1 is replaced in FIG. 2 by a current source 90. The current from current source 90 is applied to the third and fourth controlled resistance devices 14 and 16 by a switch 72, which is controlled by an overload detector 74.

In a particular configuration, the time constant of the first AGC system 60 may be too slow to enable it to respond to sudden increases in signal level before signal overload causes the AGC system to lock out. In these circumstances, the overload detector 74 is arranged to respond to these sudden increases in signal level by suddenly increasing the degeneration in the emitter circuits of the amplifying transistors 10 and 12, thereby preventing lockout.

In the following example, it is assumed that a large constant current flow is provided by the current source 90, which is sufficient to maintain $R_E$ for the amplifying transistors at approximately 70 ohms. As in the case of FIG. 1, $I_{GC1}$ current supplied by the first AGC system 60 varies the base-to-emitter resistance of devices 40 and 42 so that $Z_L$ is varied from approximately 700 ohms to 73 ohms. The amplifier will thus have a gain reduction range of 20 db.

If the amplifier is in a high gain condition to amplify low-level input signals, and the input signal level suddenly increases, the output signals at terminals 36 and 38 may be at a sufficiently high level to cause signal overload of the amplifier, as well as succeeding signal processing stages. The signal overload may cause the first AGC system to become locked out, so that the gain of the amplifier cannot be reduced by the first AGC system. To prevent the lockout condition from occurring, the overload detector senses the sudden input signal increase, and responds by opening switch 72. $R_E$ of the amplifying transistors is now suddenly increased, as devices 14 and 16 are turned off, and the emitter resistances of amplifying transistors are now approximately each half the resistance of resistor 68, in parallel with the high base-to-emitter reactive impedance of the two devices. The gain of the amplifier is now sharply decreased, since the emitter degeneration has been increased. Thus, the gain of the amplifier is suddenly reduced to prevent signal overload and AGC lockout in this example.

What is claimed is:

1. A gain-controlled amplifier comprising:

an amplifier transistor having a base electrode coupled to receive input signals, a collector electrode at which output signals are derived, and an emitter electrode;

means, coupled to said base, collector, and emitter electrodes for biasing said transistor;

a first source of control current;

a second source of control current;

a first controlled impedance device, having first and second electrodes connected by a main DC current path and a third electrode through which a significantly lesser DC current flows when said main DC current path is conductive, said first source of control current being coupled to said first electrode and said third electrode being coupled to said collector electrode of said amplifying transistor and presenting a gain controlling impedance thereat which is a function of the magnitude of the control current supplied by said first source; and a second controlled impedance device, having fourth and fifth electrodes connected by a main DC current path and a sixth electrode through which a significantly lesser DC current flows when said main DC current path of said second device is conductive, said second source of control current being coupled to said fourth electrode and said sixth electrode being coupled to said emitter electrode of said amplifying transistor and presenting a gain controlling impedance thereat which is a function of the magnitude of the control supplied by said second source.

2. The gain-controlled amplifier of claim 1, wherein the collector impedance of said amplifying transistor includes the impedance of said first device, and the emitter impedance of said amplifying transistor includes the impedance of said second device, and wherein an increase in the magnitude of said control current from said first source causes the impedance of said first device to decrease and the gain of said amplifier to decrease, and an increase in the magnitude of said control current from said second source causes the impedance of said second device to decrease and the gain of said amplifier to increase.

3. A gain-controlled amplifier comprising:
an amplifying transistor having a base electrode coupled to receive input signals, a collector electrode at which output signals are derived, and an emitter electrode;
means, coupled to said base, collector, and emitter electrodes for biasing said transistor;
a first source of control current;
a second source of control current;
a first controlled impedance device, coupled between said collector electrode of said amplifying transistor and said first source of control current, which exhibits an impedance which is a function of the magnitude of the control current supplied by said first source; and
a second controlled impedance device, coupled between said emitter electrode of said amplifying transistor and said second source of control current, which exhibits an impedance which is a function of the magnitude of the control current supplied by said second source; wherein said first controlled impedance device comprises a second transistor having a base electrode coupled to said collector electrode of said amplifying transistor, a collector electrode coupled to a point of reference potential, and an emitter electrode coupled to said first source of control current, and
wherein said second controlled impedance device comprises a third transistor having a base electrode coupled to the emitter electrode of said amplifying transistor, a collector electrode coupled to a point of reference potential, and an emitter electrode coupled to said second source of control current.

4. A gain-controlled differential amplifier comprising:
first and second transistors, each having a base electrode coupled to an input terminal, a collector electrode coupled to an output terminal, and an emitter electrode;
means, coupled to said transistors, for biasing said transistors;
a first source of control current;
a second source of control current;
first and second controlled impedance devices, each having first and second electrodes connected by a main DC current path and a third electrode through which a significantly lesser DC current flows when said main DC current path is conductive, said first source of control current being coupled to said first electrodes of said devices and said third electrodes being coupled to respective ones of said collector electrodes of said first and second transistors, and presenting a gain controlling impedance thereat which is a function of the magnitude of the control current received from said first source; and third and fourth controlled impedance devices, each having fourth and fifth electrodes connected by a main DC current path and a sixth electrode through which a significantly lesser DC current flows when said main DC current paths of said third and fourth devices are conductive, said second source of control current being coupled to said fourth electrode of said third and fourth devices and said sixth electrodes being coupled to an emitter electrode of respective ones of said first and second transistors, and presenting a gain controlling impedance thereat which is a function of the magnitude of the control current received from said second source.

5. In a television receiver, including a first automatic gain control system which develops a first control current, and a second automatic gain control system which develops a second control current, a gain-controlled amplifier comprising:
first and second transistors, each having a base electrode coupled to an input terminal, a collector electrode coupled to an output terminal, and an emitter electrode;
means, coupled to said transistors, for biasing said transistors;
first and second controlled impedance devices, each having first and second electrodes connected by a main DC current path and a third electrode through which a significantly lesser DC current flows when said main DC current path is conductive, said first electrodes of said devices being coupled to said first automatic gain control system for receiving a control current, and said third electrodes being coupled to a collector electrode of respective ones of said first and second transistors, and presenting a gain controlling impedance at said respective collector electrodes which is a function of the magnitude of the control current received from said first automatic gain control system; and
third and fourth controlled impedance devices, each having fourth and fifth electrodes connected by a main DC current path and a sixth electrode through which a significantly lesser DC current flows when said main DC current paths of said third and fourth devices are conductive, said second automatic gain control system being coupled to said fourth electrodes of said third and fourth devices and said sixth electrodes being coupled to an emitter electrode of respective ones of said first and second transistors, and presenting a gain controlling impedance at said respective emitter electrodes which is a function of the magnitude of the control current received from said second automatic gain control system.

6. The arrangement of claim 4 or 5, further comprising first and second resistors, each of which is coupled between a respective one of said collector electrodes and a source of supply potential, and
a third resistor coupled between the emitter electrodes of said first and second transistors.

7. The arrangement of claim 6, wherein said biasing means includes fourth and fifth resistors serially coupled between the emitter electrodes of said first and second transistors, and a sixth resistor coupled between the junction of said fourth and fifth resistors and a point of reference potential.

8. The arrangement of claim 6, further comprising a fourth resistor coupled in series with said third resistor, and wherein said biasing means includes a fifth resistor coupled between the junction of said third and fourth resistors and a point of reference potential.

9. The arrangement of claim 4 or 5, wherein said second and fifth electrodes of said controlled impedance devices are coupled to a point of reference potential, and wherein the current flowing through each of said second and fifth electrodes is substantially equal to said control current received by said respective device.

10. The arrangement of claim 9, wherein each of said controlled impedance devices comprises a transistor, and said third and sixth electrodes are base electrodes, said first and fourth electrodes are emitter electrodes, and said second and fifth electrodes are collector electrodes.

11. A gain-controlled amplifier which is responsive to first and second control currents produced by a current source, the ratio between said first and second control currents being variably controlled and the sum of the magnitudes of said first and second control currents being substantially constant, comprising:

a first transistor having a base electrode coupled to an input terminal, a collector electrode coupled to an output terminal, and an emitter electrode;

means, direct-current coupled to said first transistor, for biasing said transistor;

a first controlled impedance device, coupled between said collector electrode and said current source, and responsive to said first control current for exhibiting an impedance which is variable in response to variations in said first control current; and a second controlled impedance device, coupled between said emitter electrode and said current source, and responsive to said second control current for exhibiting an impedance which is variable in response to variations in said second control current.

12. The gain-controlled amplifier of claim 11, further comprising:

a second transistor having a base electrode coupled to a second input terminal, a collector electrode coupled to a second output terminal, and an emitter electrode;

means, direct-current coupled to said second transistor, for biasing said second transistor;

a third controlled impedance device, coupled between said collector electrode of said second transistor and said current source, and responsive to said first control current for exhibiting an impedance which is variable in response to variations in said first control current; and a fourth controlled impedance device, coupled between said emitter electrode of said second transistor and said current source, and responsive to said second control current for exhibiting an impedance which is variable in response to variations in said second control current.

13. The gain-controlled amplifier of claim 11 or 12, wherein decreases in the magnitude of said first control current increases the gain of said amplifier, and decreases in the magnitude of said second current decreases the gain of said amplifier.

14. The arrangement of claim 4 or 5, further comprising third and fourth transistors each of which has a base electrode coupled to a respective one of said input terminals, an emitter electrode coupled to a respective one of said base electrodes of said first and second transistor, and a collector electrode coupled to a source of supply voltage.

* * * * *